(12) United States Patent
Kim et al.

(10) Patent No.: US 9,559,138 B2
(45) Date of Patent: Jan. 31, 2017

(54) IMAGE SENSOR AND METHODS OF MANUFACTURING THE SAME

(71) Applicant: SAMSUNG ELECTRONICS CO., LTD., Suwon-Si, Gyeonggi-Do (KR)

(72) Inventors: Yi-Tae Kim, Hwaseong-Si (KR); Kyung-Ho Lee, Suwon-Si (KR); Dong-Young Jang, Suwon-Si (KR); Sung-Ho Choi, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/878,631

(22) Filed: Oct. 8, 2015

(65) Prior Publication Data

US 2016/0104740 A1    Apr. 14, 2016

(30) Foreign Application Priority Data

Oct. 10, 2014 (KR) .......................... 10-2014-0136717

(51) Int. Cl.
*H01L 31/062* (2012.01)
*H01L 31/113* (2006.01)
(Continued)

(52) U.S. Cl.
CPC ..... *H01L 27/14645* (2013.01); *H01L 27/1463* (2013.01); *H01L 27/1464* (2013.01); *H01L 27/14607* (2013.01); *H01L 27/14612* (2013.01); *H01L 27/14621* (2013.01); *H01L 27/14623* (2013.01); *H01L 27/14636* (2013.01); *H01L 27/14683* (2013.01); *H01L 27/14685* (2013.01); *H01L 27/14689* (2013.01)

(58) Field of Classification Search
CPC .................. H01L 27/14645; H01L 27/14636; H01L 27/14863
USPC .......................................... 257/292; 438/106
See application file for complete search history.

(56) References Cited

U.S. PATENT DOCUMENTS 7,042,058 B1    5/2006  Mann et al.
8,373,243 B2    2/2013  Tai et al.
(Continued)

FOREIGN PATENT DOCUMENTS

JP    2009-130215    6/2009
JP    2013-004565    1/2013
(Continued)

*Primary Examiner* — David S Blum
(74) *Attorney, Agent, or Firm* — F. Chau & Associates, LLC

(57) ABSTRACT

An image sensor includes a first substrate, a photodiode array, a first wiring structure, a second wiring structure, a third wiring structure and a light blocking layer pattern. The photodiode array is disposed in the first substrate. The photodiode array includes first photodiodes in a first region, second photodiodes in a second region and third photodiodes in a third region. The first wiring structure is disposed in the first region. The first wiring structure is electrically connected to the first photodiodes. The second wiring structure is disposed in the second region. The second wiring structure includes power supply wiring. The third wiring structure is disposed in the third region. The third wiring structure is electrically connected to the third photodiodes. The light blocking layer pattern is disposed on the first substrate. The light blocking layer pattern covers the third region and the fourth region.

20 Claims, 17 Drawing Sheets

(51) Int. Cl.
*H01L 21/44* (2006.01)
*H01L 21/48* (2006.01)
*H01L 21/50* (2006.01)
*H01L 27/146* (2006.01)

(56) References Cited

U.S. PATENT DOCUMENTS

| | | |
|---|---|---|
| 8,488,028 B2 | 7/2013 | Koike |
| 8,492,805 B2 | 7/2013 | Akiyama et al. |
| 8,587,089 B2 | 11/2013 | Chiu |
| 2009/0085143 A1 | 4/2009 | Park |
| 2013/0241022 A1 | 9/2013 | Oka |
| 2013/0321685 A1 | 12/2013 | Ahn et al. |
| 2014/0022479 A1* | 1/2014 | Hosaka ................ G02F 1/1368 349/43 |
| 2016/0118425 A1* | 4/2016 | Kurokawa ........ H01L 27/14616 257/43 |

FOREIGN PATENT DOCUMENTS

| | | |
|---|---|---|
| KR | 1020070055866 | 5/2007 |
| KR | 1020090083818 | 8/2009 |
| KR | 1020100077988 | 7/2010 |
| KR | 1020110065179 | 6/2011 |
| KR | 1020130134791 | 12/2013 |

\* cited by examiner

IMAGE SENSOR AND METHODS OF MANUFACTURING THE SAME

CROSS-REFERENCE TO RELATED APPLICATION

This application claims priority under 35 U.S.C §119 to Korean Patent Application No. 10-2014-0136717 filed on Oct. 10, 2014 in the Korean Intellectual Property Office, the disclosure of which is incorporated by reference in its entirety herein.

BACKGROUND

1. Technical Field

Exemplary embodiments of the inventive concept relate to image sensors and methods of manufacturing the same. More particularly, exemplary embodiments of the inventive concept relate to backside illumination (BSI) image sensors and methods of manufacturing the same.

2. Discussion of Related Art

An image sensor is a semiconductor device which receives an incident light, and converts the incident light into an electric signal. The image sensor may be categorized into a charge coupled device (CCD) image sensor and a complementary metal oxide semiconductor (CMOS) image sensor. Recently, a backside illumination (BSI) image sensor has been studied to improve illumination efficiency and illumination sensitivity of pixels of the image sensor.

SUMMARY

At least one embodiment of the present inventive concept provides an image sensor having an improved electrical characteristic.

At least one embodiment of the present inventive concept provides a method of manufacturing an image sensor having an improved electrical characteristic.

According to an exemplary embodiment of the present inventive concept, an image sensor is provided. The image sensor includes a first substrate, a photodiode array, a first wiring structure, a second wiring structure, a third wiring structure and a light blocking layer pattern. The first substrate has a first surface and a second surface opposed to the first surface. The first substrate is divided into a first region, a second region surrounding the first region, a third region surrounding the second region and a fourth region surrounding the third region. The photodiode array is disposed in the first substrate adjacent to the first surface. The photodiode array includes first photodiodes in the first region, second photodiodes in the second region and third photodiodes in the third region. The first wiring structure is disposed in the first region on the first surface of the first substrate. The first wiring structure is electrically connected to the first photodiodes. The second wiring structure is disposed in the second region on the first surface of the first substrate. The second wiring structure includes a power supply wiring. The third wiring structure is disposed in the third region on the first surface of the first substrate. The third wiring structure is electrically connected to the third photodiodes. The light blocking layer pattern is disposed on the second surface of the first substrate. The light blocking layer pattern covers the third region and the fourth region.

In an exemplary embodiment, the image sensor may further include a fourth wiring structure disposed in the fourth region on the first surface of the first substrate. The fourth wiring structure may include a power supply wiring.

In an exemplary embodiment, the first wiring structure may include a first wiring, a fifth wiring and a ninth wiring disposed at different levels (e.g., different planes). The second wiring structure may include a second wiring at the same level as the first wiring, a sixth wiring at the same level as the fifth wiring, a tenth wiring at the same level as the ninth wiring. The third wiring structure may include a third wiring at the same level as the first wiring, a seventh wiring at the same level as the fifth wiring, a eleventh wiring at the same level as the ninth wiring. The fourth wiring structure may include a fourth wiring at the same level as the first wiring, an eighth wiring at the same level as the fifth wiring, a twelfth wiring at the same level as the ninth wiring.

In an exemplary embodiment, the first wiring, the fifth wiring and the ninth wiring may be electrically connected to each other by first contact plugs. The third wiring, the seventh wiring and the eleventh wiring may be electrically connected to each other by second contact plugs.

In an exemplary embodiment, one of the second wiring, the sixth wiring and the tenth wiring may serve as a ground terminal. Others of the second wiring, the sixth wiring and the tenth wiring may serve as power supply wirings.

In an exemplary embodiment, the second wiring, the sixth wiring and the tenth wiring may occupy an area which is at least 80% of an area of the second region.

In an exemplary embodiment, the second wiring, the sixth wiring and the tenth wiring may substantially cover the second region.

In an exemplary embodiment, the first wiring, the second wiring, the third wiring and the fourth wiring may include the same material, and may have the same thickness. The fifth wiring, the sixth wiring, the seventh wiring and the eighth wiring may include the same material, and may have the same thickness. The ninth wiring, the tenth wiring, the eleventh wiring and the twelfth wiring may include the same material, and may have the same thickness.

In an exemplary embodiment, the image sensor may further include a color filter disposed on the second surface of the first substrate. The color filter may partially cover the light blocking layer pattern.

In an exemplary embodiment, the color filter may have a uniform thickness in the first region, and may have a non-uniform thickness in the second region.

In an exemplary embodiment, the image sensor may further include transistors disposed on the first surface of the first substrate.

In an exemplary embodiment, the image sensor may further include a second substrate facing the first surface of the first substrate. The second substrate may support the first substrate.

According to an exemplary embodiment of the present inventive concept, a method of manufacturing an image sensor is provided. In the method, a first substrate is provided to have a first surface and a second surface opposed to the first surface. The first substrate is divided into a first region, a second region surrounding the first region, a third region surrounding the second region and a fourth region surrounding the third region. A photodiode array is formed in the first substrate adjacent to the first surface. The photodiode array includes first photodiodes in the first region, second photodiodes in the second region and third photodiodes in the third region. A first wiring structure is formed in the first region, a second wiring structure is formed in the second region, and a third wiring structure is formed in the third region on the first surface of the first substrate. The first wiring structure is electrically connected to the first photodiodes. The second wiring structure includes a power supply wiring. The third wiring structure is electrically connected to the third photodiodes. A second substrate is arranged to face the first surface of the first substrate. The second substrate supports the first substrate. Portions of the first substrate adjacent to the second surface are removed. A light blocking layer pattern is formed on the second surface of the first substrate. The light blocking layer pattern covers the third region and the fourth region.

In an exemplary embodiment, the first wiring structure may include a first wiring, a fifth wiring and a ninth wiring disposed at different levels. The second wiring structure may include a second wiring at the same level as the first wiring, a sixth wiring at the same level as the fifth wiring, a tenth wiring at the same level as the ninth wiring. The third wiring structure may include a third wiring at the same level as the first wiring, a seventh wiring at the same level as the fifth wiring, a eleventh wiring at the same level as the ninth wiring.

In an exemplary embodiment, the first wiring, the second wiring, and the third wiring may be formed simultaneously. The fifth wiring, the sixth wiring, and the seventh wiring may be formed simultaneously. The ninth wiring, the tenth wiring, and the eleventh wiring may be formed simultaneously.

According to an exemplary embodiment of the inventive concept, an image sensor is provided. The image sensor includes a first substrate, a photodiode array, first through third wiring structures, and a light blocking layer pattern. The first substrate has a first surface and a second surface opposed to the first surface. The first substrate is divided into a first region, a second region surrounding the first region, a third region surrounding the second region and a fourth region surrounding the third region. The photodiode array is disposed in the first substrate adjacent to the first surface. The photodiode array includes first photodiodes in the first region, second photodiodes in the second region and third photodiodes in the third region. The first wiring structure is disposed in the second region on the first surface of the first substrate. The first wiring structure includes a power supply wiring. The second wiring structure is disposed in the third region on the first surface of the first substrate. The second wiring structure is electrically connected to the third photodiodes. The third wiring structure is disposed in the second region on the first surface of the first substrate. The third wiring structure includes a power supply wiring. The light blocking layer pattern is disposed on the second surface of the first substrate. The light blocking layer pattern covers the third region and the fourth region.

In an exemplary embodiment, the image sensor further includes a fourth wiring structure disposed in the first region on the first surface of the first substrate, where the fourth wiring structure is electrically connected to the first photodiodes.

According to an exemplary embodiment of the inventive concept, an image sensor includes a wiring structure including a power supply wiring in a second region II. That is, the power supply wirings are disposed not only in the fourth region IV, but also in the second region II, so that the electrical resistance of the power supply wirings may decrease, and an IR drop in the power supply wirings may also decrease. Therefore, an electrical characteristic of the image sensor may be improved, and an area of a peripheral region (that is, the second region II, the third region III and the fourth region IV) may decrease.

BRIEF DESCRIPTION OF THE DRAWINGS

Exemplary embodiments of the inventive concept will be more clearly understood from the following detailed description taken in conjunction with the accompanying drawings.

DETAILED DESCRIPTION

Figure 1:
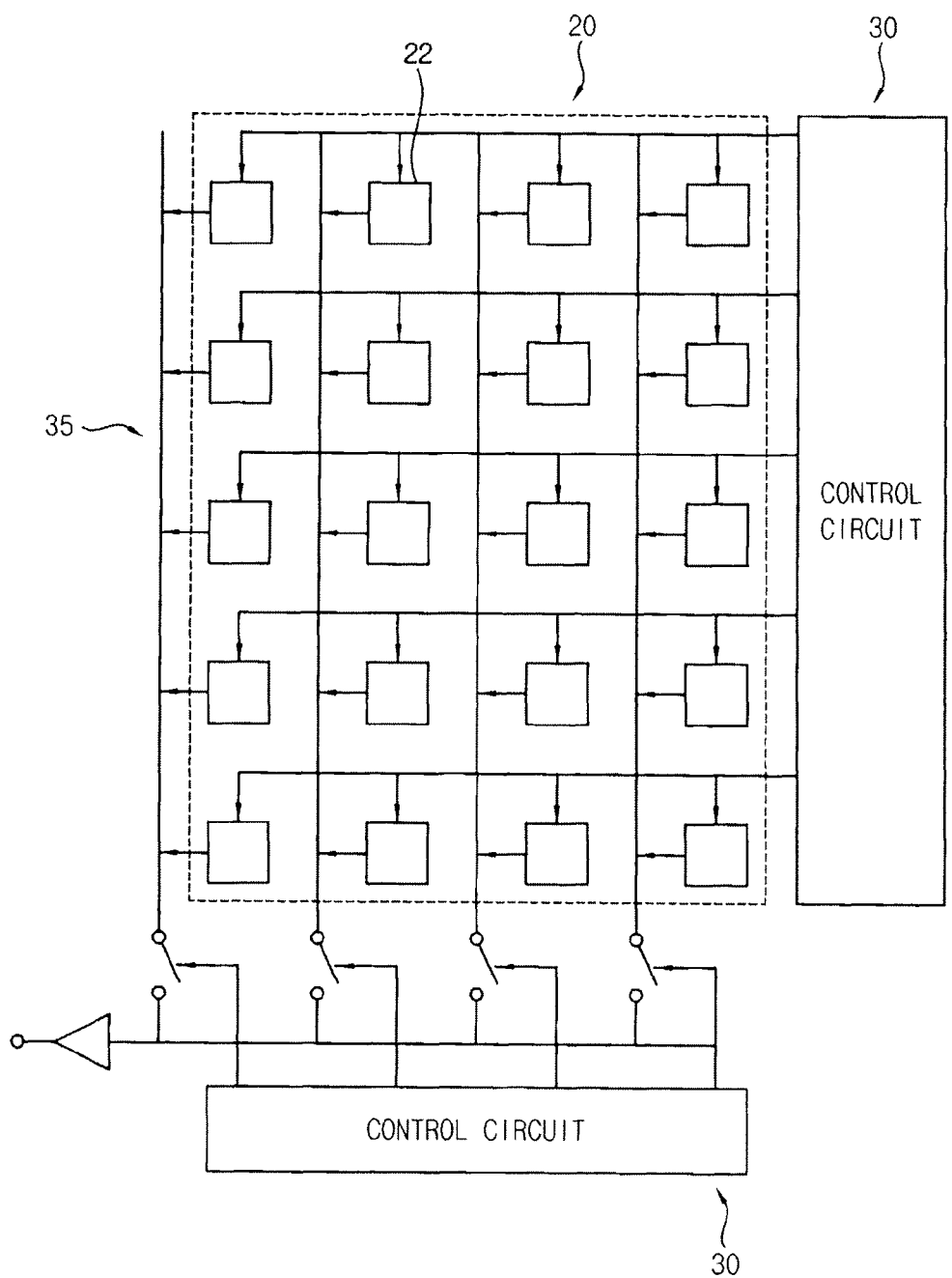
FIG. 1 is a layout view illustrating an image sensor in accordance with an exemplary embodiment of the inventive concept.

The inventive concept will be described more fully hereinafter with reference to the accompanying drawings, in which exemplary embodiments thereof are shown. The present inventive concept may, however, be embodied in many different forms and should not be construed as limited to the exemplary embodiments set forth herein. Rather, these exemplary embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present.

As used herein, the singular forms "a," "an" and "the" are intended to include the plural forms as well, unless the context clearly indicates otherwise.

FIG. 1 is a layout view illustrating an image sensor in accordance with exemplary embodiment of the inventive concept.

Referring to FIG. 1, an image sensor 10 includes a pixel array region 20, control circuits 30 and power supply wirings 35. The pixel array region 20 may include a plurality of unit pixels 22 arranged in a matrix form. The control circuits 30 disposed adjacent to the pixel array region 20 may provide the pixel array region 20 with a predetermined signal, or may control an output signal. Further, the power supply wirings 35 may serve to provide each unit pixel 22 of the pixel array region 20 with power.

However, as a resolution of the image sensor 10 increases, an area ratio occupied by the pixel array region may also increase. Therefore, an area occupied by the control circuits 30 and the power supply wirings 35 may decrease. When the power supply wirings 35 are arranged in a reduced area, a size of the power supply wirings 35 may decrease, and an electrical resistance of the power supply wirings 35 may increase. Therefore, an electrical characteristic of the image sensor 10 may be degraded.

Figure 2:
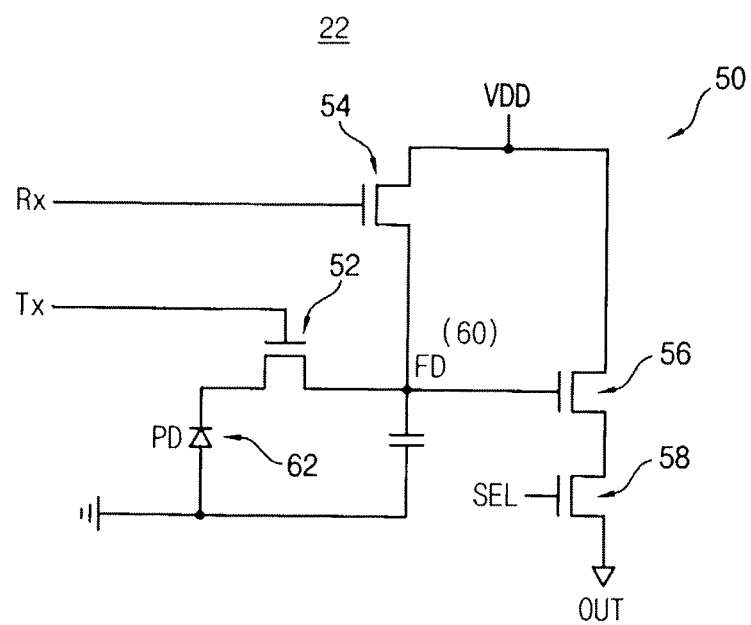
FIG. 2 is a schematic circuit diagram illustrating an unit pixel in accordance with an exemplary embodiment of the inventive concept.

FIG. 2 is a schematic circuit diagram illustrating a unit pixel in accordance with an exemplary embodiment of the inventive concept.

Referring to FIG. 2, the unit pixel 22 includes a photodiode (PD) for sensing light, a transfer transistor 52 for transferring photons in the photodiode (PD) into a floating diffusion region (FD), a reset transistor 52 for resetting the floating diffusion region (FD), a drive transistor 56 for generating an electrical signal corresponding to photons in the floating diffusion region (FD) and a selection transistor 58 transferring the electrical signal to an external portion of the unit pixel 22.

The transfer transistor 52 may be controlled by a transfer control signal (Tx), the reset transistor 54 may be controlled by a reset control signal (Rx), and the control transistor 58 may be controlled by a selection control signal (SEL). The transfer control signal (Tx), the reset control signal (Rx) and the selection control signal (SEL) may be transferred from the control circuits 30 described with reference to FIG. 1 to the unit pixel 22.

Further, an image sensor may be categorized as a front side illumination image sensor or a backside illumination (BSI) image sensor. Since light incident into the image sensor is partially blocked by the wirings, the front side illumination image sensor may have relatively low illumination efficiency. While in the case of the BSI image sensor, the wirings are not disposed at an incident side (that is, backside) in the pixel array region 22 (See, FIG. 1), so that the BSI image sensor may have an improved illumination efficiency compared to the front side illumination image sensor.

Figure 3:
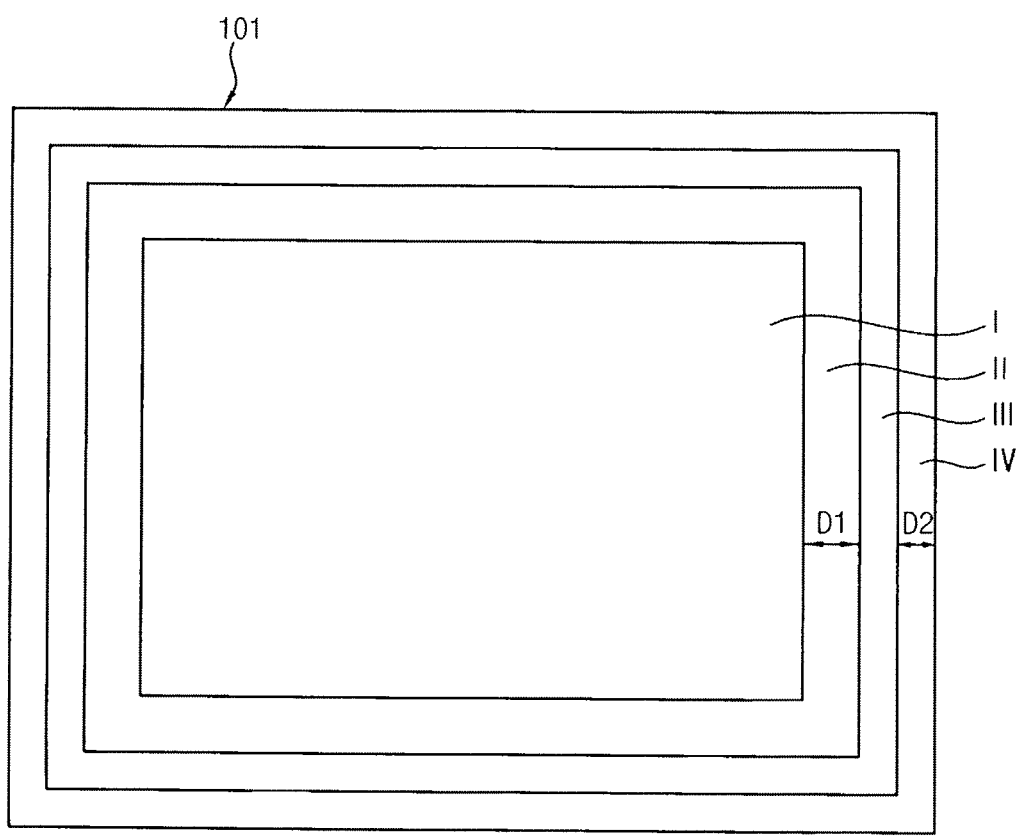
FIGS. 3 to 6 are plan views and cross-sectional views illustrating an image sensor in accordance with exemplary embodiments of the inventive concept.
Figure 4:
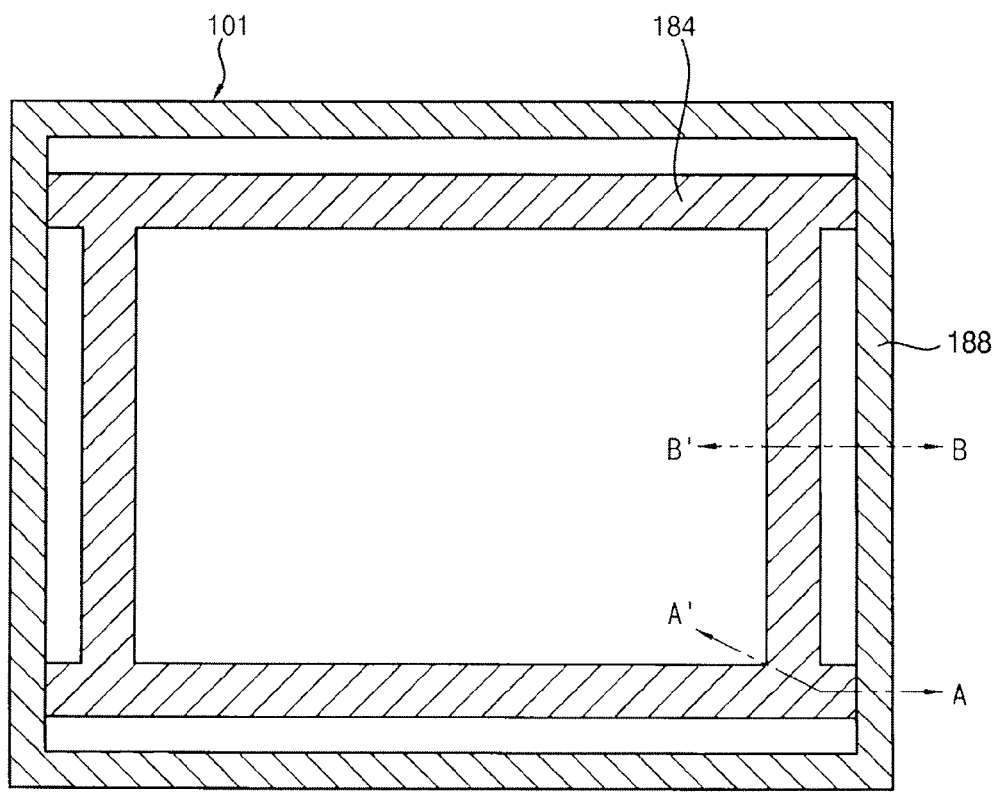
Figure 5:
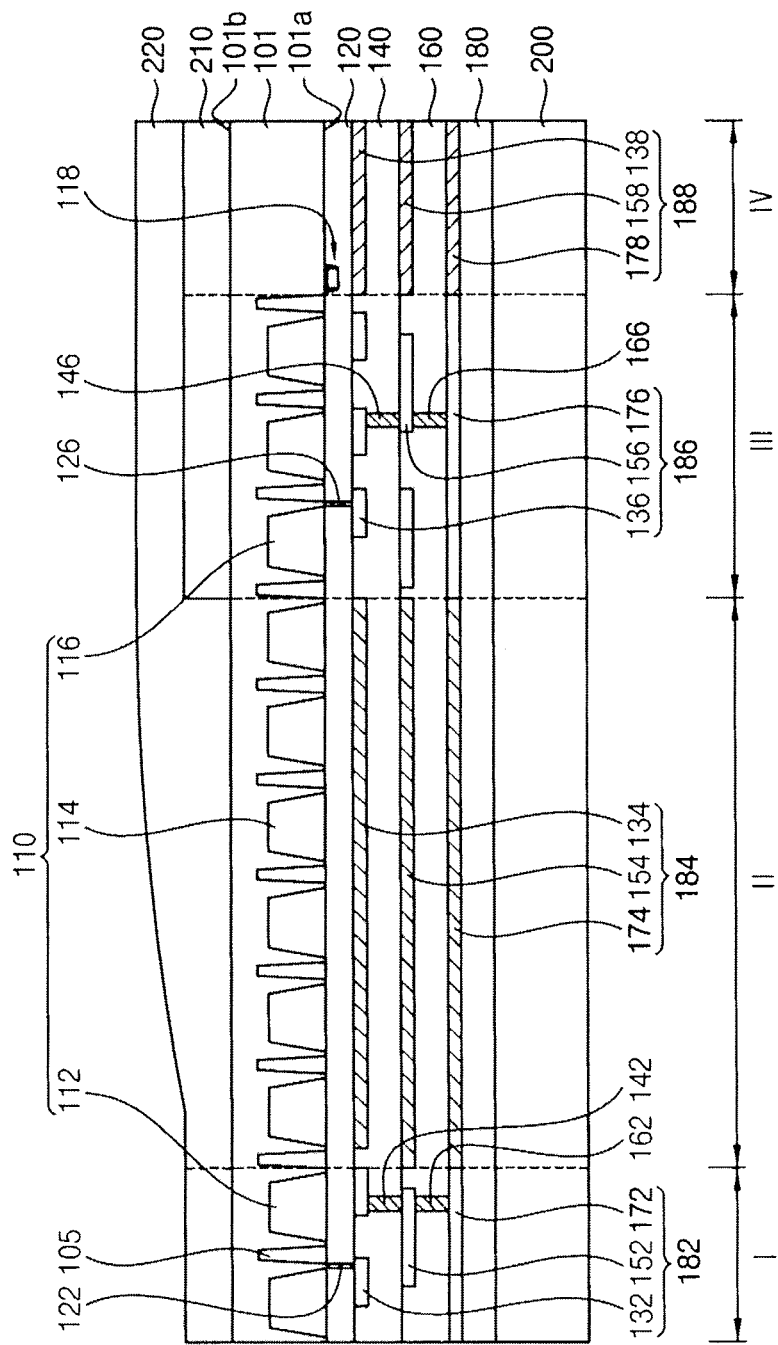
Figure 6:
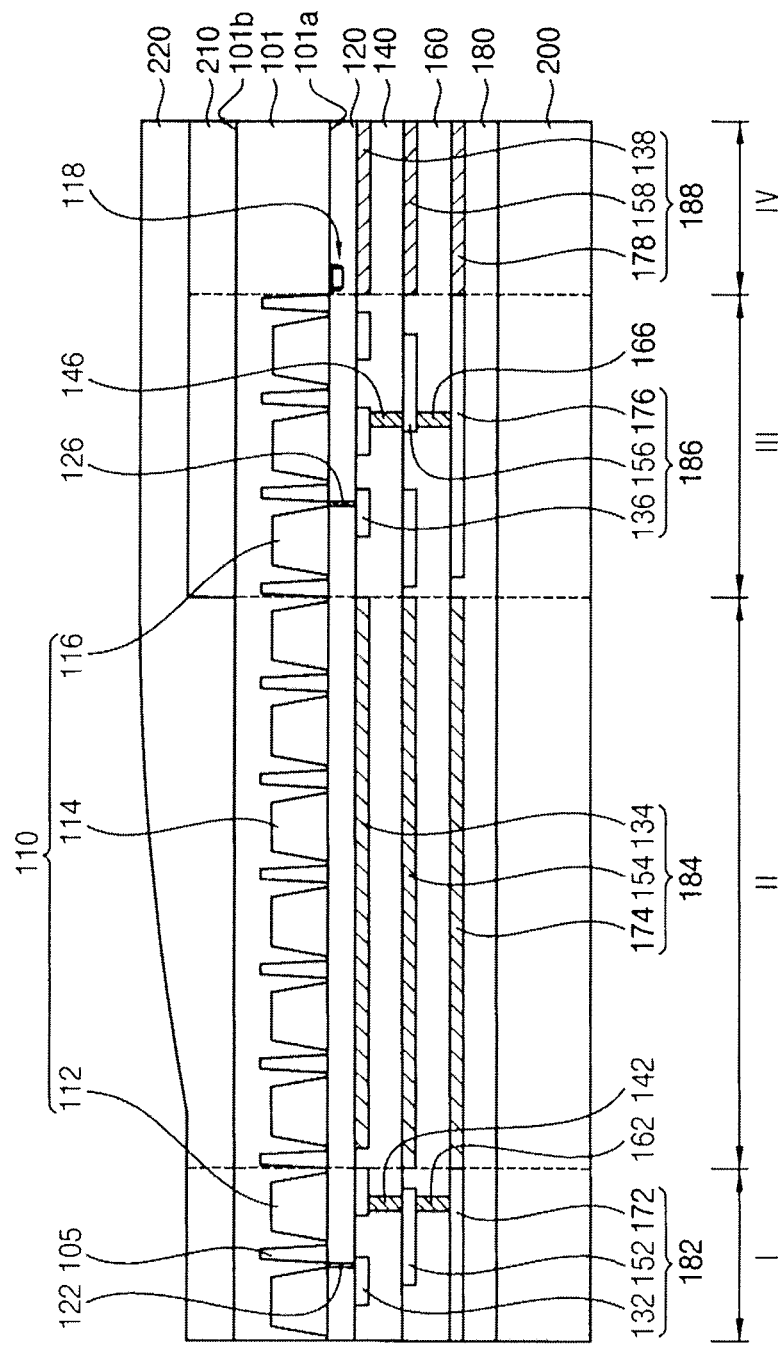

FIGS. 3 to 6 are plan views and cross-sectional views illustrating an image sensor in accordance with exemplary embodiments of the inventive concept. FIG. 3 is a plan view illustrating a substrate of the image sensor in accordance with an exemplary embodiment of the inventive concept, and FIG. 4 is a plan view illustrating a second wiring structure and a fourth wiring structure in accordance with exemplary embodiments of the inventive concept. FIG. 5 is a cross-sectional view cut along line A-A' of FIG. 4, and FIG. 6 is a cross-sectional view cut along line B-B' of FIG. 4.

Referring to FIG. 3, a first substrate 101 of the image sensor is divided into a first region I, a second region II, a third region III and a fourth region IV.

The first region I may be disposed at a central portion of the first substrate 101. The photodiodes (PD) disposed in the first region I receive light, and convert the received light into an electrical signal which is transferred into the control circuit 30 (See, FIG. 1). In an exemplary embodiment, the first region I of the first substrate 101 occupies an area which is greater than about 50% of an entire area of the first substrate 101. For example, the first region I may be an active pixel region.

The second region II surrounds the first region I. The photodiode (PD) disposed in the second region II receives light, but does not convert the received light into an electrical signal. In an exemplary embodiment, the second region II overlaps a region where a thickness of a color filter layer 220 changes. For example, the second region II may overlap a region where the color filter layer 220 has different thicknesses. For example, the second region II may be an open dummy region.

The third region III surrounds the second region II. The photodiode (PD) disposed in the third region III does not receive light. However, the photodiode (PD) disposed in the third region III does transfer an electrical signal into the control circuits 30. The control circuits 30 compare some electrical signals from the first region I with other electrical signals from the third region III, so that the control circuit calculates an amount of light received by the first region I (that is, the electrical signals from the third region III may serve as a reference value). For example, the third region may be an optical black (OB) region.

The fourth region IV surrounds the third region III. The photodiode (PD) is not disposed in the fourth region IV. In an exemplary embodiment, the control circuits 30 and the wirings 35 described with reference to FIG. 1 are disposed in the fourth region IV. For example, the fourth region IV may be a guard ring region.

Further, the second region II has a first width D1, and the fourth region IV has a second width D2. In an exemplary embodiment, the first width D1 is greater than the second width D2. For example, when the second width D2 is about 20 μm, the first width D1 is in a range of about 30 μm to about 80 μm.

In an exemplary embodiment, each of the second region II, the third region III and the fourth region IV surround four sides of each of the first region I, the second region II and the third region III, respectively, as illustrated in FIG. 3. However, embodiments the present inventive concept are not limited thereto. For example, each of the second region II, the third region III and the fourth region IV may surround at least one side of each of the first region I, the second region II and the third region III, respectively.

Referring to FIGS. 4 to 6, the image sensor includes a first substrate 101, a second substrate 200 opposed to the first substrate 101, a photodiode array 110 located in the first substrate 101, wiring structures 182, 184, 186 and 188 located on a first surface 101a of the first substrate 101, a light blocking layer pattern 210 and a color filter 220 on a second surface 101b of the first substrate 101.

The first substrate 101 may include a semiconductor material. The first substrate 101 may have a first surface 101a and a second surface 101b that oppose each other. The first substrate 101 of the image sensor in accordance with an exemplary embodiment of the inventive concept does not need to include a silicon-on-insulator (SOI) substrate which may be relatively expensive. Therefore, the first substrate 101 may include a bulk single crystal silicon substrate. An incident light may pass through the first substrate 101 from the second surface 101b to the first surface 101a, so that the image sensor may have an improved efficiency, when a thickness of the first substrate 100 decreases. For example, the first substrate 101 may have a thickness in a range of from about 1 μm to about 100 μm.

The photodiode array 110 may be disposed in the first substrate 101 adjacent to the first surface 101a. The photodiode array 110 may be disposed in the first region I, the second region II and the third region III of the first substrate 101. In an exemplary embodiment, first photodiodes 112 are disposed in the first region I of the first substrate 101, second photodiodes 114 are disposed in the second region II of the first substrate 101, and third photodiodes 116 are disposed in the third region III of the first substrate 101.

Each of the first photodiodes 112, the second photodiodes 114 and the third photodiodes 116 may constitute a unit pixel. Further, each of the first photodiodes 112, the second photodiodes 114 and the third photodiodes 116 may be separated from one another by an isolation layer 105. For example, an isolation layer 105 may be located between two of the first photodiodes 112, between one of the first photodiodes 112 and one of the second photodiodes 114, between one of the second photodiodes 114 and one of the third photodiodes 116, and between two of the third photodiodes 116.

The light blocking layer pattern 210 may be disposed on the second surface 101*b* of the first substrate 101. In an exemplary embodiment of the inventive concept, the light blocking layer pattern 210 covers (e.g., entirely covers) the third region III and the fourth region IV of the first substrate 101. Therefore, the third photodiodes 116 disposed in the third region III do not receive the incident light, while the first photodiodes 112 and the second photodiodes 114 disposed in the first region I and the second region II may receive the incident light.

Further, the color filter 220 is disposed on the second surface 101*b* of the first substrate 101 to cover the light blocking layer pattern 210. The color filter 220 allows the incident light having a predetermined wavelength to pass through. Due to a stepped portion of the light blocking layer pattern 210, the color filter 220 may have a non-uniform thickness in the second region II of the first substrate 101. However, the color filter 220 may have a uniform thickness in the first region I of the substrate 101 where the first photodiode 112 is located. That is, the color filter 220 may filter a uniform amount of the incident light in the first region I, and may filter a non-uniform amount of the incident light in the second region II. Due to the non-uniform thickness of the color filter 220 in the second region II, the second region II may serve as the open dummy region, and the second photodiode 114 does not serve as an active photo-sensor.

Referring now to FIGS. 5 and 6, a transistor 118 may be disposed on the first surface 101*a* of the first substrate 101.

In an exemplary embodiment of the inventive concept, the transistor 118 is disposed in the fourth region IV of the first substrate 101 as illustrated in FIGS. 5 and 6, however embodiments of the present inventive concept are not limited thereto. For example, other transistors may be disposed in the first region I, the second region II and the third region III of the first substrate 101.

In an exemplary embodiment of the inventive concept, other transistors disposed in the first region I, the second region II and the third region III of the first substrate 101 may be the transfer transistor, the reset transistor, the drive transistor and the selection transistor described with reference to FIG. 2. Further, the transistors 118 disposed in the fourth region IV of the first substrate 101 may constitute a peripheral circuit (for example, the control circuits 30 in FIG. 2).

Further, the wirings structures 182, 184, 186 and 188 may be disposed on the first surface 101*a* of the first substrate 101. In this case, each of the wiring structures 182, 184, 186 and 188 may include multilevel wirings, and each of the wirings may be separated by insulating interlayers 120, 140, 160 and 180.

In an exemplary embodiment of the inventive concept, the first wiring structure 182 is disposed in the first region I and the second wiring structure 184 is disposed in the second region II. In an exemplary embodiment, the third wiring structure 186 is disposed in the third region III, and the fourth wiring structure 188 is disposed in the fourth region IV.

The first wiring structure 182 may include a first wiring 132, a fifth wiring 152 and a ninth wiring 172. The first wiring 132, the fifth wiring 152 and the ninth wiring 172 may be directly or indirectly electrically connected to the first photodiode 112 by a first contact 122, a third contact 142 and a fifth contact 162. That is, the first wiring structure 182 transfers an electrical signal from the first photodiode 112 into the control circuit (e.g., 30).

The third wiring structure 186 may include a third wiring 136, a seventh wiring 156 and a eleventh wiring 176. The third wiring 136, the seventh wiring 156 and the eleventh wiring 176 may be directly or indirectly electrically connected to the third photodiode 116 by a second contact 126, a fourth contact 146 and a sixth contact 166. That is, the third wiring structure 186 may transfer an electrical signal from the third photodiode 116 into the control circuit.

The second wiring structure 184 may include a second wiring 134, a sixth wiring 154 and a tenth wiring 174. The second wiring 134, the sixth wiring 154 and the tenth wiring 174 do not transfer an electrical signal from the second photodiode 114 into the control circuit (e.g., 30). The second wiring 134, the sixth wiring 154 and the tenth wiring 174 may serve as a power supply wiring. Further, some of the second wiring 134, the sixth wiring 154 and the tenth wiring 174 may serve as a ground terminal.

The fourth wiring structure 188 includes a fourth wiring 138, an eighth wiring 158 and a twelfth wiring 178. The fourth wiring 138, the eighth wiring 158 and the twelfth wiring 178 may serve as a power supply wiring. Further, some of the fourth wiring 138, the eighth wiring 158 and the twelfth wiring 178 may serve as a ground terminal.

As illustrated in FIGS. 4 and 5, the second wiring structure 184 in the second region II and the fourth wiring structure 188 in the fourth region IV are electrically connected to each other.

Accordingly, the power supply wirings may be disposed not only in the fourth region IV, but also in the second region II, so that the electrical resistance of the power supply wirings may decrease, and an IR drop in the power supply wirings may also decrease. Therefore, an electrical characteristic of the image sensor may be improved, and an area of a peripheral region (that is, the second region II, the third region III and the fourth region IV) may decrease.

In an exemplary embodiment of the inventive concept, the second substrate 200 is disposed to face the first surface 101*a* of the first substrate 101. The second substrate 200 may cover and support the first substrate 101.

Figure 7:
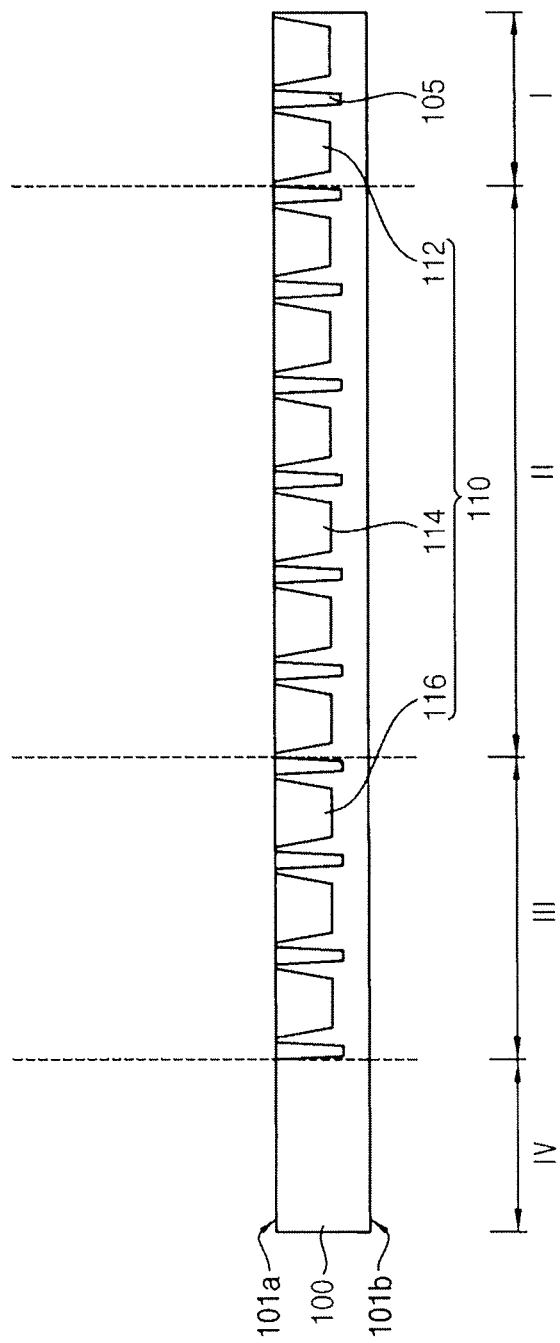
FIGS. 7 to 12 are cross-sectional views illustrating a method of manufacturing an image sensor in accordance with exemplary embodiments of the inventive concept.

FIGS. 7 to 12 are cross-sectional views illustrating a method of manufacturing an image sensor in accordance with exemplary embodiments of the inventive concept;

Referring to FIG. 7, an isolation layer 105 and a photodiode array 110 may be formed on a preliminary first substrate 100.

The preliminary first substrate 100 may include a semiconductor material. The preliminary first substrate 100 may be divided into a first region I, a second region II, a third region III and a fourth region IV. The first region I, the second region II, the third region III and the fourth region IV may be substantially identical to or substantially similar to those described with reference to FIG. 3. For example, the first region I may be an active pixel region, the second region II may be an open dummy region, the third region III may be an optical black region, and the fourth region IV may be a guard ring region.

Further, the preliminary first substrate 100 may have a first surface 101*a* and a second surface 101*b* that oppose each other.

The isolation layer 105 may be formed in the preliminary first substrate 100 adjacent to the first surface 101a. Therefore, the preliminary first substrate 100 may be divided into an active region and a field region. In an exemplary embodiment of the inventive concept, a trench may be formed in the preliminary first substrate 100 by a shallow trench isolation (STI) process, and an insulation material may be filled into the trench, thereby forming the isolation layer.

Further, the photodiode array 110 may be formed in the preliminary first substrate 100 adjacent to the first surface 101a. The photodiode array 110 may be formed in the first region I, the second region II, and the third region III of the preliminary first substrate 100. In an exemplary embodiment of the inventive concept, first photodiodes 112 are formed in the first region I, second photodiodes 114 are formed in the second region II, and third photodiodes 116 are formed in the third region III.

In an exemplary embodiment of the inventive concept, the photodiode array 110 is formed by performing ion implantation processes using a plurality ion implantation mask, repeatedly. For example, a P-type impurity region and an N-type impurity region adjacent to the first surface 101a may be sequentially formed by the ion implantation processes, thereby forming a P—N type photodiode having an P-N junction. Alternatively, an N-type impurity region and a P-type impurity region adjacent to the first surface 101a may be sequentially formed by the ion implantation processes, thereby forming an N—P type photodiode having an N-P junction.

Figure 8:
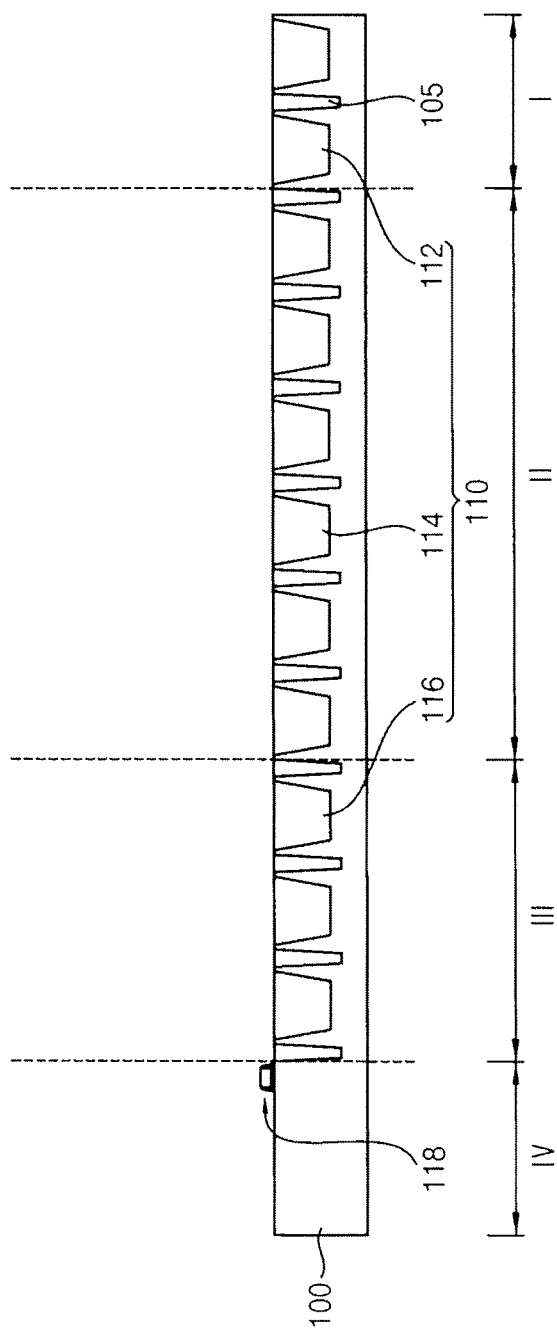

Referring to FIG. 8, a transistor 118 may be formed on the first surface 101a of the preliminary first substrate 100.

In an exemplary embodiment of the inventive concept, a gate insulation layer and a gate electrode layer are formed on the first surface 101a of the preliminary first substrate 100, and the gate electrode layer is patterned to form a gate electrode. Further, impurity regions may be formed at an upper portion of the preliminary first substrate 100 adjacent to the gate electrode, thereby forming the transistor 118.

In an exemplary embodiment of the inventive concept, the transistor 118 is disposed in the fourth region IV of the preliminary first substrate 100 as illustrated in FIG. 8, however embodiments of the present inventive concept are not limited thereto. For example, other transistors may be disposed in the first region I, the second region II and the third region III of the preliminary first substrate 100.

In an exemplary embodiment of the inventive concept, other transistors disposed in the first region I, the second region II and the third region III of the preliminary first substrate 100 may be the transfer transistor, the reset transistor, the drive transistor and the selection transistor described with reference to FIG. 2. Further, the transistors 118 disposed in the fourth region IV of the preliminary first substrate 100 may constitute a peripheral circuit (for example, the control circuits 30 in FIG. 2).

Referring to FIGS. 7 and 8, the transistor 118 may be formed after forming the photodiode array 110, however embodiments of the present inventive concept are not limited thereto. For example, a sequence of the process may be adjusted as necessary.

Figure 9:
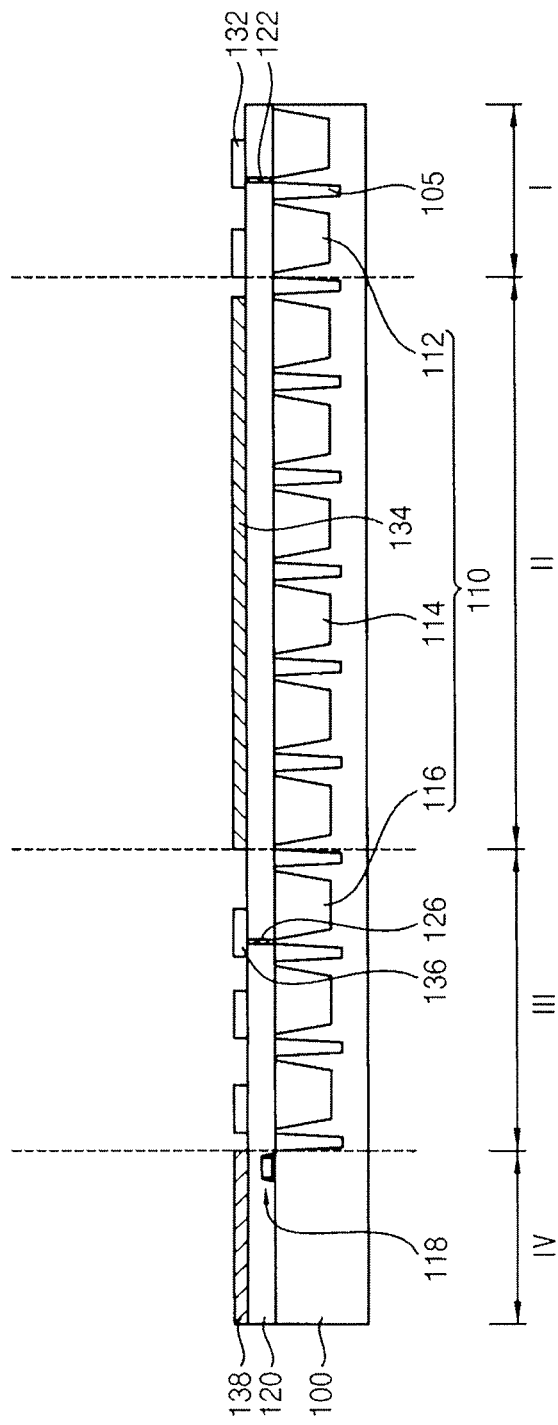

Referring to FIG. 9, a first insulating interlayer 120 may be formed to cover the transistor 118, and contact plugs 122 and 126 may be formed through the first insulating interlayer 120. Further, wirings 132, 134, 136 and 138 may be formed on the first insulating interlayer 120.

In an exemplary embodiment of the inventive concept, a conductive layer is formed on the first insulating interlayer 120 and the contact plugs 122 and 126, and then the conductive layer is patterned to form the wirings 132, 134, 136 and 138, simultaneously.

The wirings 132, 134, 136 and 138 may be disposed in corresponding regions of the preliminary first substrate 100, respectively. In an exemplary embodiment of the inventive concept, the first wirings 132 are formed in the first region I, the second wirings 134 are disposed in the second region II, the third wirings 136 are disposed in the third region III, and the fourth wirings 138 are disposed in the fourth region IV.

The first wirings 132 may be electrically connected to the first photodiodes 112 (and transistors in the first region I) by the first contact plug 122, and the third wirings 136 may be electrically connected to the third photodiodes 116 (and transistors in the third region III) by the second contact plug 126.

In an exemplary embodiment of the inventive concept, the second wirings 134 substantially cover the second region II, and the fourth wirings 138 substantially cover the fourth region IV. For example, in an exemplary embodiment, the second wirings 134 occupy an area which is at least 80% of an area of the second region II, and the fourth wirings 138 occupy an area which is at least 80% of an area of the fourth region IV.

Further, the second wirings 134 and the fourth wirings 138 do not receive an electrical signal generated from the photodiode array. The second wirings 134 and the fourth wirings 138 may serve as a power supply wiring or a ground terminal, as described with reference to FIGS. 5 and 6.

The wirings 132, 134, 136 and 138 and the contact plugs 122 and 126 may be formed using a metal or a metal alloy. For example, the wirings 132, 134, 136 and 138 and the contact plugs 122 and 126 may be formed using copper (Cu), platinum (Pt), tungsten (W), aluminum (Al), or alloys thereof. Further, a barrier layer may be further formed to surround the wirings 132, 134, 136 and 138 and the contact plugs 122 and 126 to prevent a diffusion of the metal materials.

Figure 10:
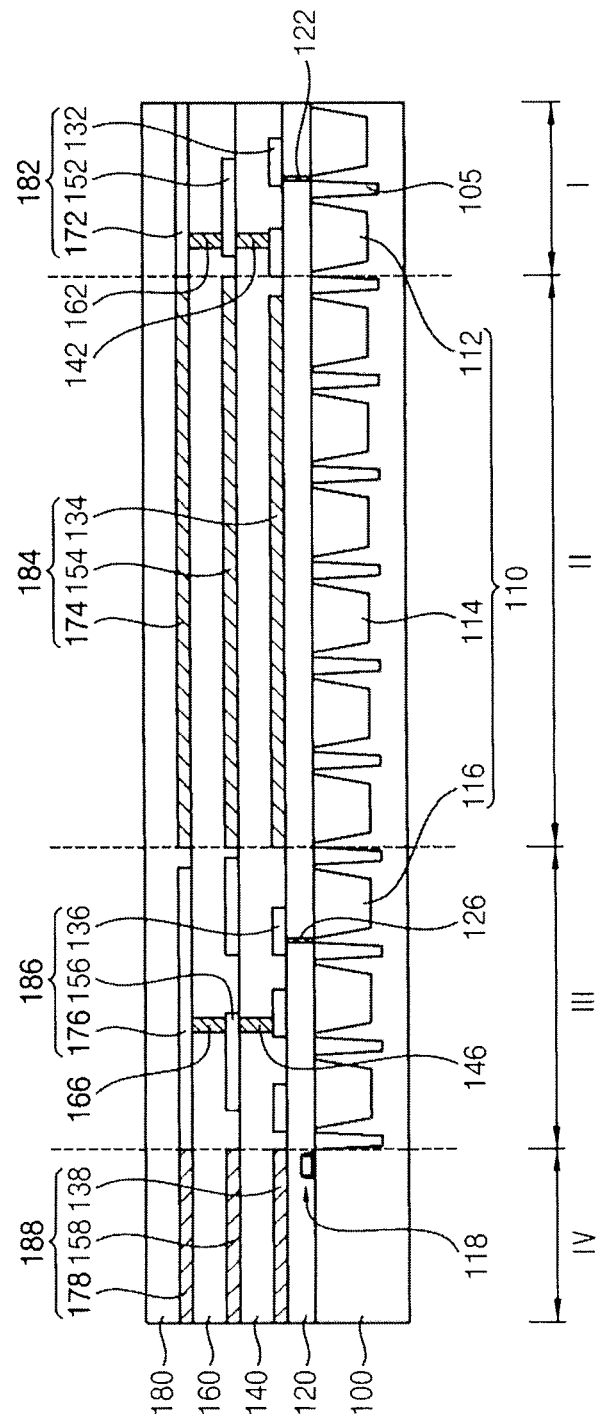

Referring to FIG. 10, a second insulating interlayer 140 may be formed to cover the wirings 132, 134, 136 and 138, and contact plugs 142 and 146 may be formed through the second insulating interlayer 140. Further, wirings 152, 154, 156 and 158 may be formed on the second insulating interlayer 140.

In an exemplary embodiment of the inventive concept, processes for forming the contact plugs 142, 146, 162 and 166 and wirings 152, 154, 156, 158, 172, 174, 176 and 178 may be substantially identical to or substantially similar to those described with reference to FIG. 9.

In an exemplary embodiment of the inventive concept, the fifth wirings 152 are disposed in the first region I, the sixth wirings 154 are disposed in the second region II, the seventh wirings 156 are disposed in the third region III, and the eighth wirings 158 are disposed in the fourth region IV.

The fifth wirings 152 may be electrically connected to the first photodiodes 112 (and transistors in the first region I) by the third contact plug 142, and the seventh wirings 156 may be electrically connected to the third photodiodes 116 (and transistors in the third region III) by the fourth contact plug 146. That is, the fifth wirings 152 and the seventh wirings 156 may transfer electrical signals generated from the first photodiodes 112 and the third photodiodes 116, respectively.

In an exemplary embodiment of the inventive concept, the sixth wirings 154 substantially cover the second region II, and the eighth wirings 158 substantially cover the fourth region IV. For example, in an exemplary embodiment, the sixth wirings 154 occupy an area which is at least 80% of an area the second region II, and the eighth wirings 158 occupy an area which is at least 80% of an area of the fourth region IV.

The sixth wirings 154 and the eighth wirings 158 may serve as a power supply wiring or a ground terminal, as described with reference to FIGS. 5 and 6.

Then, a third insulating interlayer 160 may be formed to cover the wirings 152, 154, 156 and 158, and contact plugs 162 and 166 may be formed through the third insulating interlayer 160. Further, wirings 172, 174, 176 and 178 may be formed on the third insulating interlayer 160. A fourth insulating interlayer 180 may be formed to cover the wirings 172, 174, 176 and 178.

In an exemplary embodiment of the inventive concept, the ninth wirings 172 are disposed in the first region I, the tenth wirings 174 are disposed in the second region II, the eleventh wirings 176 are disposed in the third region III, and the twelfth wirings 178 are disposed in the fourth region IV. Each of the wirings 172, 174, 176 and 178 may serve roles substantially identical to or substantially similar to those of each of the wirings 152, 154, 156 and 158, respectively.

Accordingly, the first wirings 132, the fifth wirings 152 and the ninth wirings 172 in the first region I constitute a first wiring structure 182, and the second wirings 134, the sixth wirings 154, the tenth wirings 174 in the second region II constitute a second wiring structure 184. The third wirings 136, the seventh wirings 156 and the eleventh wirings 176 in the third region III constitute a third wiring structure 186, and the fourth wirings 138, the eighth wirings 158 and the twelfth wirings 178 in the fourth region IV constitute a fourth wiring structure 188.

Accordingly, the first wiring structure 182 may transfer electrical signals generated from the first photodiodes 112, and the third wiring structure 186 may transfer electrical signals generated from the third photodiodes 116.

In an exemplary embodiment of the inventive concept, the second wiring structure 184 and the fourth wiring structure 188 serve as a power supply wiring. For example, the second wiring structure 184 may supply power to the circuits disposed in the first region I and the second region II, and the fourth wiring structure 188 may supply power to the circuits disposed in the third region III and the fourth region IV.

In an exemplary embodiment of the inventive concept, some wirings of the second wiring structure 184 or the fourth wiring structure 188 serve as a ground terminal.

Accordingly, the power supply wirings may be disposed not only in the fourth region IV, but also in the second region II, so that the electrical resistance of the power supply wirings may decrease, and an IR drop in the power supply wirings may also decrease. Therefore, an electrical characteristic of the image sensor may be improved, and an area of a peripheral region (that is, the second region II, the third region III and the fourth region IV) may decrease.

Figure 11:
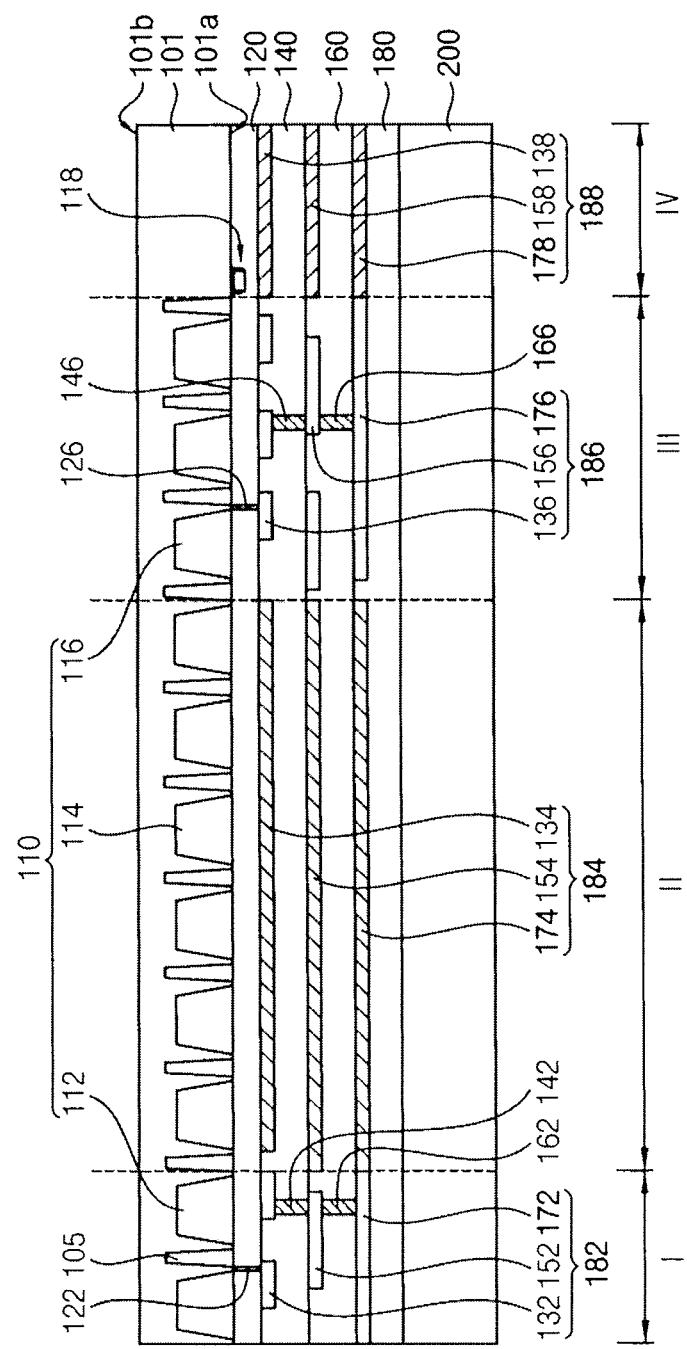

Referring to FIG. 11, a second substrate 200 is fixed on the fourth insulating interlayer 180. For example, the fourth insulating layer 180 is formed on the second substrate 200.

Then, portions of the preliminary first substrate 100 adjacent to the second surface 101*b* may be grinded, so that a thickness of the preliminary first substrate 100 is decreased. As the grinding process is performed, a first substrate 101 may be formed to have a thickness in a range of from about 1 μm to about 10 μm.

The following process may be performed on the second surface 101*b* of the first substrate 101.

Figure 12:
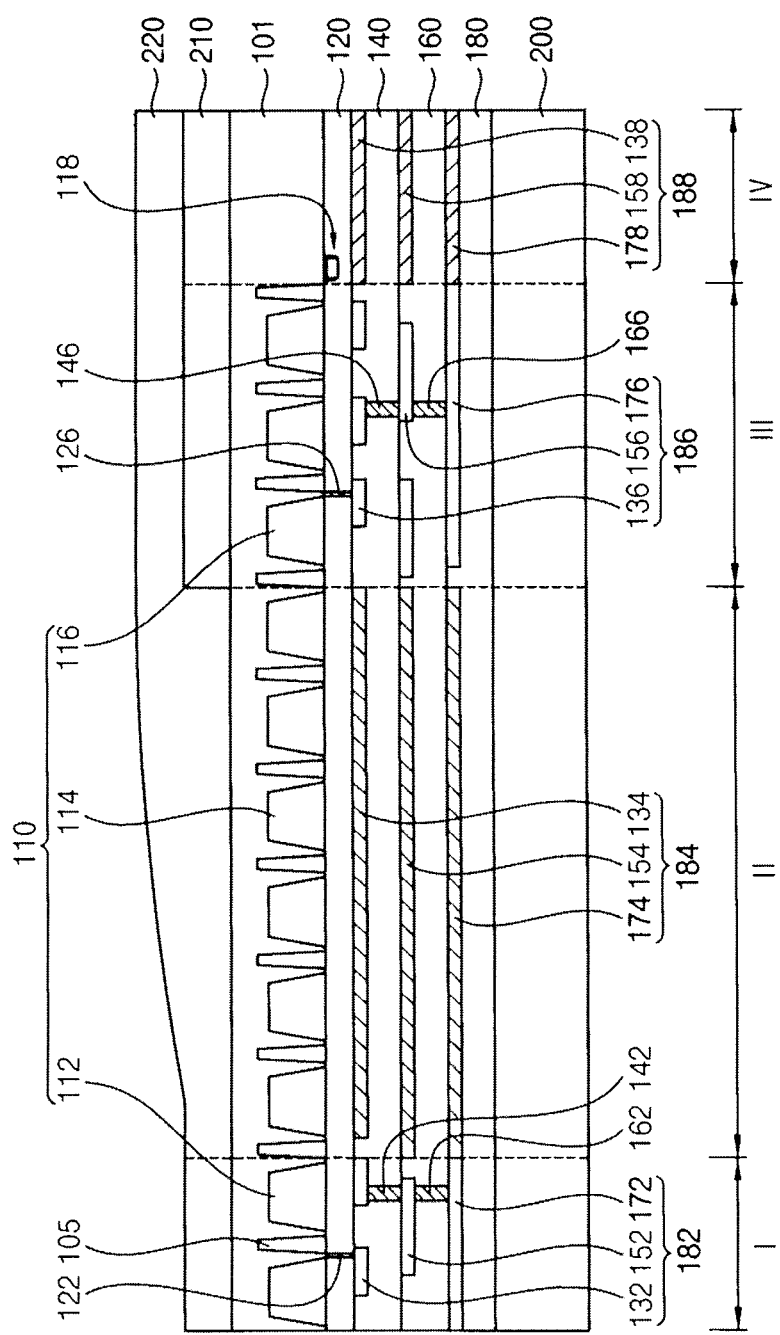

Referring to FIG. 12, a light blocking layer pattern 210 and a color filter 220 are formed on the second surface 101*b* of the first substrate 101.

In an exemplary embodiment of the inventive concept, a light blocking layer is formed on the second surface 101*b* of the first substrate 101, and the light blocking layer is partially removed to form the light blocking layer pattern 210. The light blocking layer pattern 210 may substantially cover the third region III and the fourth region IV of the first substrate 101. Therefore, the third photodiode 116 in the third region III does not receive the incident light.

Since the light blocking layer pattern 210 is disposed in the third region III, a stepped portion may be formed between the third region III (where the light blocking layer pattern 210 locates) and the second region II (where the light blocking layer pattern 210 is not located).

Then, the color filter 220 may be formed on the second surface 101*b* of the first substrate 101 to cover the light blocking layer pattern 210. Due to a stepped portion of the light blocking layer pattern 210, the color filter 220 has a non-uniform thickness in the second region II of the first substrate 101. However, the color filter 220 has a uniform thickness in the first region I of the substrate 101 where the first photodiode 112 is located. That is, the color filter 220 may filter a uniform amount of the incident light in the first region I, and may filter a non-uniform amount of the incident light in the second region II.

According to an exemplary embodiment of the inventive concept, the second photodiode 114 is not electrically connected to the second wiring structure 184, so that the second wiring structure 184 does not transfer the electrical signal generated from the second photodiode 114. The second wiring structure 184 may serve as the power supply wirings instead of the signal transfer wirings. Therefore, the electrical resistance of the power supply wirings may decrease, and an IR drop in the power supply wirings may also decrease.

Further, the first to fourth wiring structures 182, 184, 186, 188 may be formed simultaneously, so that an additional process may not be required.

Figure 13:
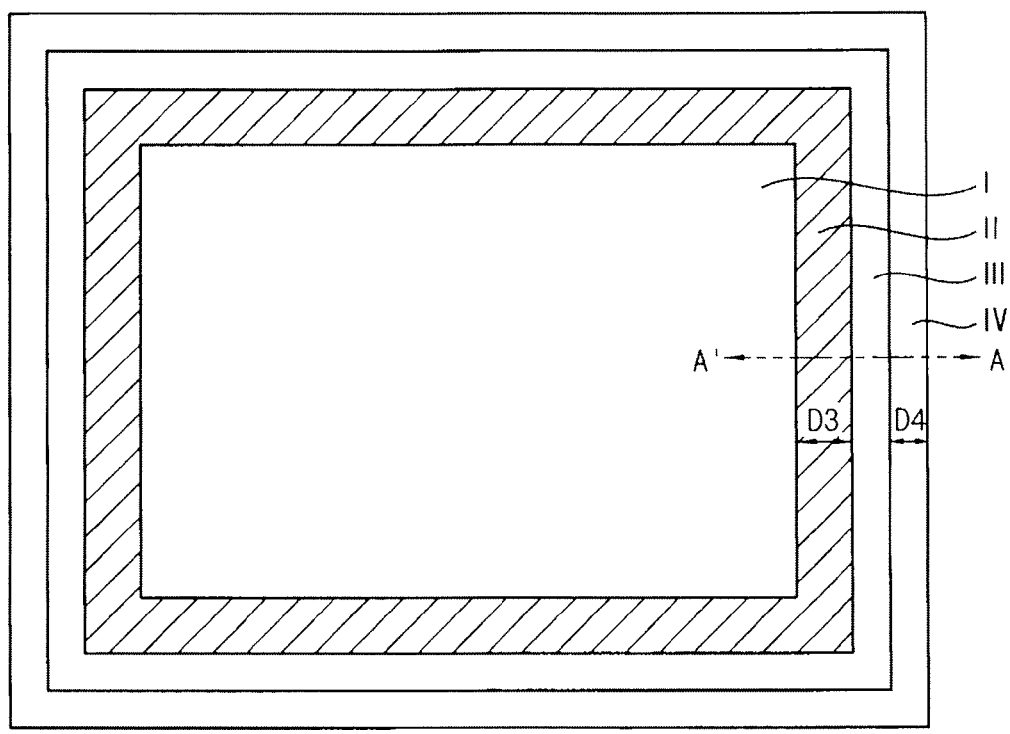
FIGS. 13 and 14 are a plan view and a cross-sectional view illustrating an image sensor in accordance with exemplary embodiments of the inventive concept.
Figure 14:
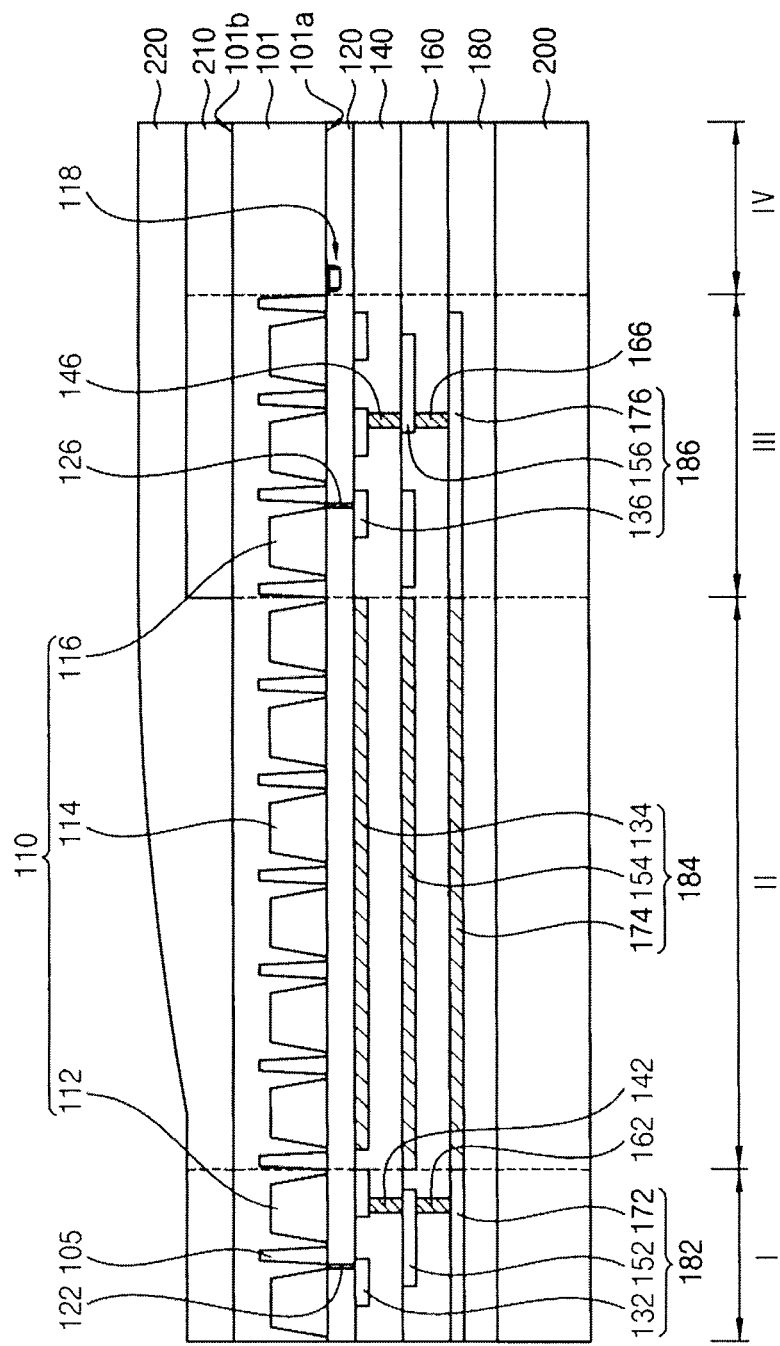

FIGS. 13 and 14 are a plan view and a cross-sectional view illustrating an image sensor in accordance with an exemplary embodiment of the inventive concept. FIG. 13 is a plan view illustrating a second wiring structure 184 in accordance with an exemplary embodiment of the inventive concept, and FIG. 14 is a cross-sectional view cut along line A-A'. The image sensor of FIGS. 13 and 14 may be substantially similar to those described with reference to FIGS. 3 to 6, except for a fourth wiring structure.

Referring to FIGS. 13 and 14, the image sensor includes a first substrate 101, a second substrate 200 opposed to the first substrate 101, a photodiode array 110 in the first substrate 101, wiring structures 182, 184 and 186 on a first surface 101*a* of the first substrate 101, a light blocking layer pattern 210 and a color filter 220 on a second surface 101*b* of the first substrate 101.

The second region II has a third width D3, and the fourth region IV has a fourth width D4. In an exemplary embodiment of the inventive concept, the third width D3 is at least two times greater than the fourth width D4. That is, an area of the second region II may be greater than that of the fourth region IV.

The second wiring structure 184 may serve as a power supply wiring. When the area of the second region II is greater than that of the fourth region IV, the power supply wiring in the second region II may have a reduced electrical resistance as compared to a case where the power supply wiring is disposed in the fourth region IV. Therefore, the image sensor may have an improved electrical characteristic.

In an exemplary embodiment of the inventive concept, the power supply wirings are not disposed in the fourth region IV. However, some signal transfer wirings (not shown) may be disposed in the fourth region IV.

Figure 15:
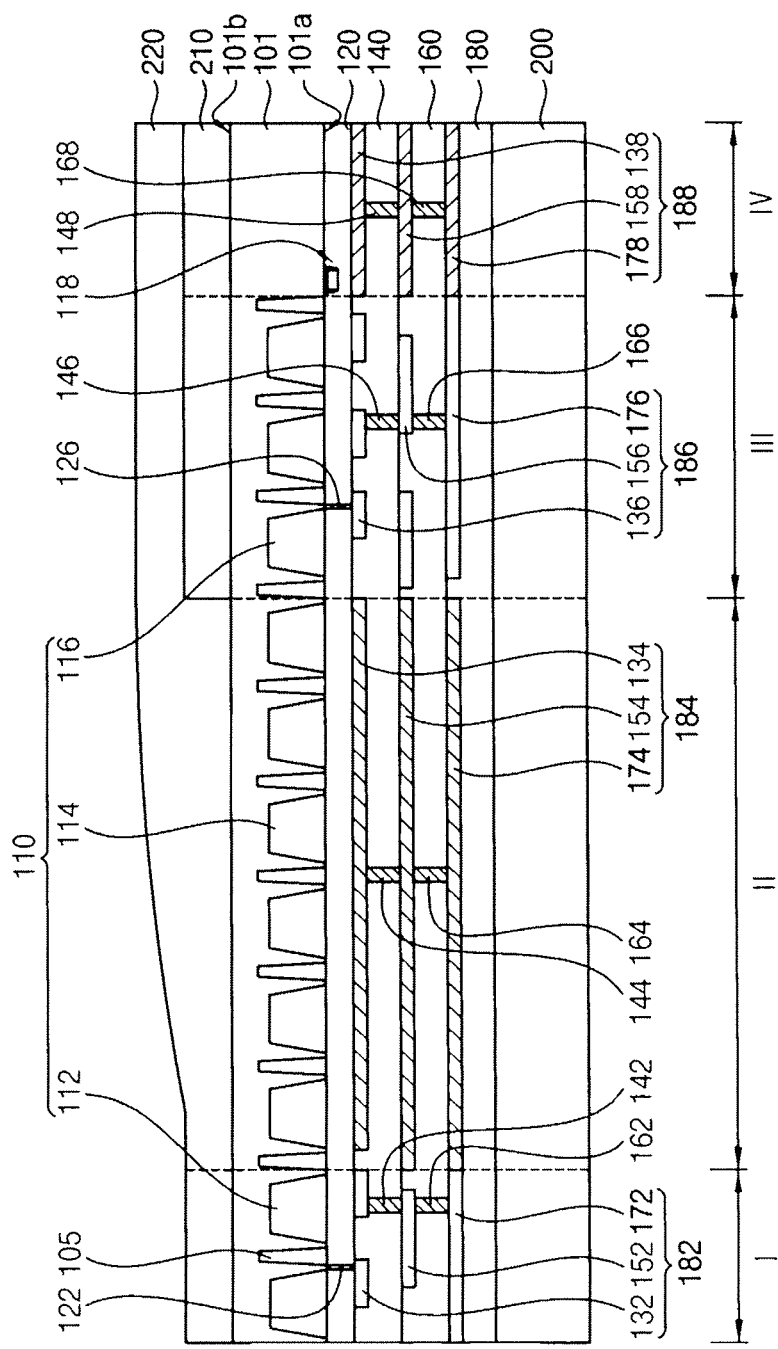
FIG. 15 is a cross-sectional view illustrating an image sensor in accordance with exemplary embodiments of the inventive concept.

FIG. 15 is a cross-sectional view illustrating an image sensor in accordance with an exemplary embodiment of the inventive concept. The image sensor of FIG. 15 may be substantially similar to those described with reference to FIGS. 3 to 6, except for contact plugs.

Referring to FIG. 15, the image sensor includes a first substrate 101, a second substrate 200 opposed to the first substrate 101, a photodiode array 110 located in the first substrate 101, wiring structures 182, 184, 186 and 188 located on a first surface 101a of the first substrate 101, a light blocking layer pattern 210 and a color filter 220 located on a second surface 101b of the first substrate 101.

The second wiring structure 184 may include a second wiring 134, a sixth wiring 154 and a tenth wiring 174. In this case, the second wiring 134, the sixth wiring 154 and the tenth wiring 174 may be electrically connected by a seventh contact plug 144 and a ninth contact plug 164. The second wiring 134, the sixth wiring 154 and the tenth wiring 174 do not transfer an electrical signal generated from a second photodiode 114 in the second region II. For example, the second wiring 134, the sixth wiring 154 and the tenth wiring 174 do not transfer an electrical signal generated from a second photodiode 114 to the control circuit 30. The second wiring 134, the sixth wiring 154 and the tenth wiring 174 may serve as a power supply wiring. Since the second wiring 134, the sixth wiring 154 and the tenth wiring 174 may be electrically connected by the seventh contact plug 144 and the ninth contact plug 164, an electrical resistance of the second wiring structure 184 may also decrease.

The fourth wiring structure 188 may include a fourth wiring 138, an eighth wiring 158 and a twelfth wiring 178. In this case, the fourth wiring 138, the eighth wiring 158 and the twelfth wiring 178 may be electrically connected by a eighth contact plug 148 and a tenth contact plug 168. Therefore, an electrical resistance of the fourth wiring structure 188 may also decrease.

Figure 16:
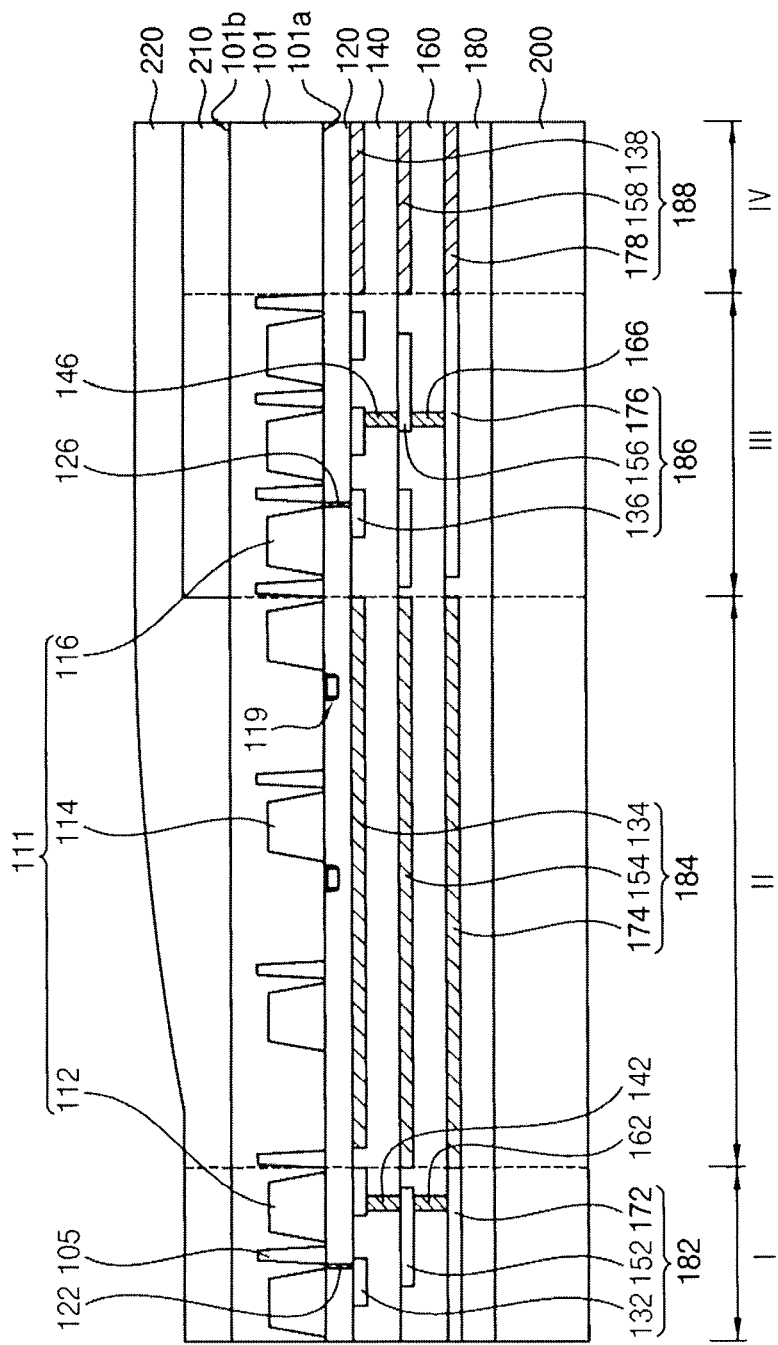
FIG. 16 is a cross-sectional view illustrating an image sensor in accordance with exemplary embodiments of the inventive concept.

FIG. 16 is a cross-sectional view illustrating an image sensor in accordance with an exemplary embodiment of the inventive concept. The image sensor of FIG. 16 may be substantially similar to those described with reference to FIGS. 3 to 6, except for transistors 119 and a photodiode array 111.

Referring to FIG. 16, the image sensor includes a first substrate 101, a second substrate 200 opposed to the first substrate 101, a photodiode array 111 located in the first substrate 101, wiring structures 182, 184, 186 and 188 located on a first surface 101a of the first substrate 101, a light blocking layer pattern 210 and a color filter 220 located on a second surface 101b of the first substrate 101.

The photodiode array 111 may include first photodiodes 112 in a first region I, second photodiodes 114 in a second region II, and third photodiode 116 in a third region III. In an exemplary embodiment of the inventive concept, the first photodiodes 112 are substantially identical to the third photodiodes 116 except for the location. However, each of the second photodiodes 114 are spaced apart from each other with a distance greater than those of the first photodiodes 112 and the third photodiodes 116. Alternatively, some of the second photodiodes 114 may be omitted.

In an exemplary embodiment, the transistor 119 is disposed in the second region II instead of the second photodiodes 114. In an exemplary embodiment, the transistors 116 disposed in the second region II constitute a peripheral circuit (for example, the control circuits 30 in FIG. 2).

Figure 17:
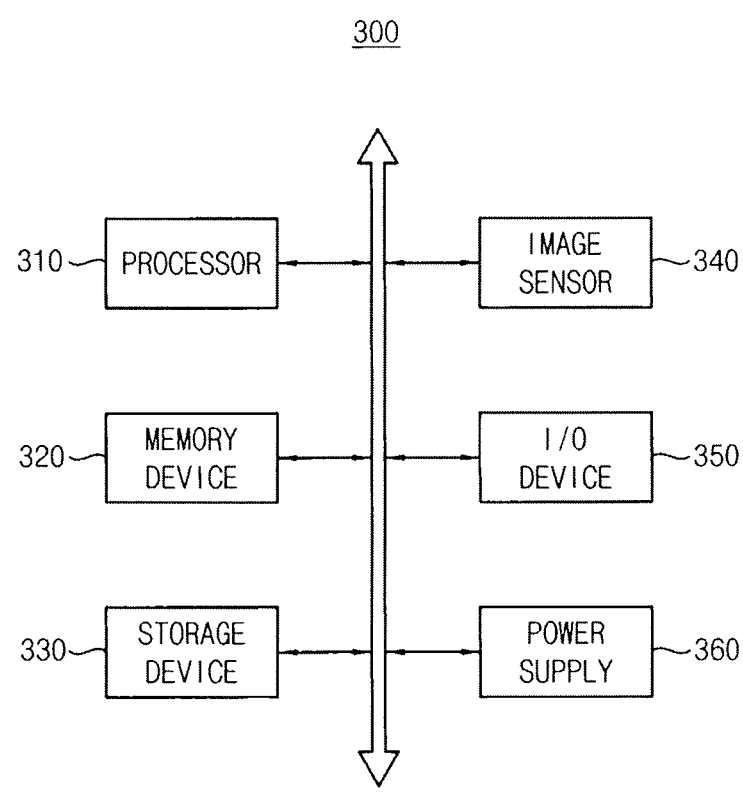
FIG. 17 is a schematic diagram illustrating an electronic system using an image sensor in accordance with an exemplary embodiment of the inventive concept.

FIG. 17 is a schematic diagram illustrating an electronic system using an image sensor in accordance with an exemplary embodiment of the inventive concept.

Referring to FIG. 17, the system 300 includes an image sensor 340. The system 300 may further include a processor 310, a memory device 320, a storage device 330, an 110 device 350 and a power supply 360. However, additional components may also be included in the system 300.

The system 300, for example, a processor-based computer system, may include the processor 310 such as a microprocessor or a central processing unit (CPU) such that the processor 310 communicates with the 110 device 350 using a bus. The image sensor 340 may communicate using the bus or a similar communication link. In addition, the memory device 320, the storage device 330 and/or the power supply 360 further included in the system 300, may communicate with the processor 310 through the bus. The system 300 may further include a port that is able to communicate with a video card, a sound card, a memory card, a universal serial bus USB device and/or the other systems. In an exemplary embodiment, the image sensor 340 is integrated with a microprocessor, a CPU, a digital signal processor and/or the memory device 320. In an exemplary embodiment, the image sensor 340 and the processor 310 are fabricated as two separate integrated circuit chips. In an exemplary embodiment, the image sensor 340 is a BSI image sensor or a front side illumination image sensor.

For example, the system 300 may include a computer system, a camera system, a scanner, a navigation system used in a vehicle, a video phone, a surveillance system, an auto-focus system, a tracking system, a motion sensing system, an image stabilizing system, or the like.

The foregoing is illustrative of exemplary embodiments of the inventive concept and is not to be construed as limiting thereof. Although a few exemplary embodiments have been described, those skilled in the art will readily appreciate that many modifications are possible in the exemplary embodiments without materially departing from the present inventive concept. Accordingly, all such modifications are intended to be included within the scope of the present inventive concept.

What is claimed is:

1. An image sensor, comprising:
a first substrate having a first surface and a second surface opposed to the first surface, the first substrate being divided into a first region, a second region surrounding the first region, a third region surrounding the second region and a fourth region surrounding the third region;
a photodiode array disposed in the first substrate adjacent to the first surface, the photodiode array including first photodiodes in the first region, second photodiodes in the second region and third photodiodes in the third region;
a first wiring structure disposed in the first region on the first surface of the first substrate, the first wiring structure being electrically connected to the first photodiodes;
a second wiring structure disposed in the second region on the first surface of the first substrate, the second wiring structure including a power supply wiring;

a third wiring structure disposed in the third region on the first surface of the first substrate, the third wiring structure being electrically connected to the third photodiodes; and a light blocking layer pattern disposed on the second surface of the first substrate, the light blocking layer pattern covering the third region and the fourth region.

2. The image sensor of claim 1, further comprising a fourth wiring structure disposed in the fourth region on the first surface of the first substrate, wherein the fourth wiring structure includes a power supply wiring.

3. The image sensor of claim 2, wherein the first wiring structure includes a first wiring, a fifth wiring and a ninth wiring disposed at different levels, wherein the second wiring structure includes a second wiring at the same level as the first wiring, a sixth wiring at the same level as the fifth wiring, a tenth wiring at the same level as the ninth wiring, wherein the third wiring structure includes a third wiring at the same level as the first wiring, a seventh wiring at the same level as the fifth wiring, a eleventh wiring at the same level as the ninth wiring, and wherein the fourth wiring structure includes a fourth wiring at the same level as the first wiring, an eighth wiring at the same level as the fifth wiring, a twelfth wiring at the same level as the ninth wiring.

4. The image sensor of claim 3, wherein the first wiring, the fifth wiring and the ninth wiring are electrically connected to each other by first contact plugs, and wherein the third wiring, the seventh wiring and the eleventh wiring are electrically connected to each other by second contact plugs.

5. The image sensor of claim 3, wherein one of the second wiring, the sixth wiring and the tenth wiring serves as a ground terminal, wherein others of the second wiring, the sixth wiring and the tenth wiring serve as power supply wirings.

6. The image sensor of claim 3, wherein the second wiring, the sixth wiring and the tenth wiring occupy an area which is at least 80% of an area of the second region.

7. The image sensor of claim 3, wherein the second wiring, the sixth wiring and the tenth wiring substantially cover the second region.

8. The image sensor of claim 7, wherein the first wiring, the second wiring, the third wiring and the fourth wiring include the same material, and have the same thickness, wherein the fifth wiring, the sixth wiring, the seventh wiring and the eighth wiring include the same material, and have the same thickness, and wherein the ninth wiring, the tenth wiring, the eleventh wiring and the twelfth wiring include the same material, and have the same thickness.

9. The image sensor of claim 1, further comprising a color filter disposed on the second surface of the first substrate, wherein the color filter partially covers the light blocking layer pattern.

10. The image sensor of claim 9, wherein the color filter has a uniform thickness in the first region, and has a non-uniform thickness in the second region.

11. The image sensor of claim 1, further comprising transistors disposed on the first surface of the first substrate.

12. The image sensor of claim 1, further comprising a second substrate facing the first surface of the first substrate, wherein the second substrate supports the first substrate.

13. A method of manufacturing an image sensor, the method comprising:

providing a first substrate having a first surface and a second surface opposed to the first surface, the first substrate being divided into a first region, a second region surrounding the first region, a third region surrounding the second region and a fourth region surrounding the third region;

forming a photodiode array in the first substrate adjacent to the first surface, the photodiode array including first photodiodes in the first region, second photodiodes in the second region and third photodiodes in the third region;

forming a first wiring structure in the first region, a second wiring structure in the second region, a third wiring structure in the third region on the first surface of the first substrate, the first wiring structure being electrically connected to the first photodiodes, the second wiring structure including a power supply wiring, and the third wiring structure being electrically connected to the third photodiodes;

arranging a second substrate to face the first surface of the first substrate, the second substrate supporting the first substrate;

removing portions of the first substrate adjacent to the second surface; and forming a light blocking layer pattern on the second surface of the first substrate, the light blocking layer pattern covering the third region and the fourth region.

14. The method of manufacturing an image sensor of claim 13, wherein the first wiring structure includes a first wiring, a fifth wiring and a ninth wiring disposed at different levels, wherein the second wiring structure includes a second wiring at the same level as the first wiring, a sixth wiring at the same level as the fifth wiring, a tenth wiring at the same level as the ninth wiring, and wherein the third wiring structure includes a third wiring at the same level as the first wiring, a seventh wiring at the same level as the fifth wiring, a eleventh wiring at the same level as the ninth wiring.

15. The method of manufacturing an image sensor of claim 14, wherein the first wiring, the second wiring, and the third wiring are formed simultaneously, wherein the fifth wiring, the sixth wiring, and the seventh wiring are formed simultaneously, and wherein the ninth wiring, the tenth wiring, and the eleventh wiring are formed simultaneously.

16. An image sensor, comprising:

a first substrate having a first surface and a second surface opposed to the first surface, the first substrate being divided into a first region, a second region surrounding the first region, a third region surrounding the second region and a fourth region surrounding the third region;

a photodiode array disposed in the first substrate adjacent to the first surface, the photodiode array including first photodiodes in the first region, second photodiodes in the second region and third photodiodes in the third region;

a first wiring structure disposed in the second region on the first surface of the first substrate, the first wiring structure including a power supply wiring;

a second wiring structure disposed in the third region on the first surface of the first substrate, the second wiring structure being electrically connected to the third photodiodes;

a third wiring structure disposed in the second region on the first surface of the first substrate, the third wiring structure including a power supply wiring;

a light blocking layer pattern disposed on the second surface of the first substrate, the light blocking layer pattern covering the third region and the fourth region.

17. The image sensor of claim 16, further comprising a fourth wiring structure disposed in the first region on the first surface of the first substrate, the fourth wiring structure being electrically connected to the first photodiodes.

18. The image sensor of claim 16, wherein the fourth wiring structure includes a first wiring, a fifth wiring and a ninth wiring disposed at different levels, wherein the first wiring structure includes a second wiring at the same level as the first wiring, a sixth wiring at the same level as the fifth wiring, a tenth wiring at the same level as the ninth wiring, wherein the second wiring structure includes a third wiring at the same level as the first wiring, a seventh wiring at the same level as the fifth wiring, a eleventh wiring at the same level as the ninth wiring, and wherein the third wiring structure includes a fourth wiring at the same level as the first wiring, an eighth wiring at the same level as the fifth wiring, a twelfth wiring at the same level as the ninth wiring.

19. The image sensor of claim 18, wherein the first wiring, the fifth wiring and the ninth wiring are electrically connected to each other by first contact plugs, and wherein the third wiring, the seventh wiring and the eleventh wiring are electrically connected to each other by second contact plugs.

20. The image sensor of claim 18, wherein one of the second wiring, the sixth wiring and the tenth wiring serves as a ground terminal, wherein others of the second wiring, the sixth wiring and the tenth wiring serve as power supply wirings.

* * * * *